United States Patent [19]

Ling

[11] Patent Number: 6,078,796
[45] Date of Patent: Jun. 20, 2000

[54] METHOD AND APPARATUS FOR RECEIVING A WIDEBAND SIGNAL USING MULTIPLE AUTOMATIC GAIN CONTROLLERS

[75] Inventor: Fuyun Ling, Hoffman Estates, Ill.

[73] Assignee: Motorola, Inc., Schaumburg, Ill.

[21] Appl. No.: 09/015,088

[22] Filed: Jan. 29, 1998

[51] Int. Cl.[7] .................................................. H04B 1/18
[52] U.S. Cl. ................................ 455/234.1; 455/240.1; 455/241.1; 455/247.1; 375/148
[58] Field of Search .......................... 455/234.1, 234.2, 455/235.1, 241.1, 245.1, 245.2, 246.1, 247.1, 250, 251.1, 253.2, 132, 138, 303, 562, 65; 330/124 R; 375/200, 205, 345, 148, 347

[56] References Cited

U.S. PATENT DOCUMENTS

| | | | |
|---|---|---|---|
| 4,509,206 | 4/1985 | Carpe et al. | 455/234.2 |
| 4,794,343 | 12/1988 | Yang | 330/124 R X |
| 5,504,775 | 4/1996 | Chouly et al. | 375/205 |
| 5,631,921 | 5/1997 | Schilling | 375/200 |
| 5,678,213 | 10/1997 | Myer | 455/303 X |

*Primary Examiner*—Fan Tsang
*Assistant Examiner*—Philip J. Sobutka
*Attorney, Agent, or Firm*—Sayed Hossain Beladi

[57] ABSTRACT

A receiver (300) for use in a wideband code division multiple access (CDMA) wireless communication system is disclosed. The system conveys at least first and second CDMA signals by a carriers centered at first and second carrier frequencies. The receiver includes a radio frequency (RF) receiver front end (204) for receiving the first and second CDMA signals to yield a set of in-phase (I) and quaternary phase (Q) components. First and second filters (222, 224) responsive to mixers (210, 214) filter the set of in-phase (I) and quaternary phase (Q) components to produce a filtered first and second set of in-phase (I) and quaternary phase (Q) components. First and second digital automatic gain controllers (400) adjust the filtered first and second set of in-phase (I) and quaternary phase (Q) components to produce a gain adjusted first and second set of in-phase (I) and quaternary phase (Q) components for use in subsequent despreading.

26 Claims, 7 Drawing Sheets

FIG. 1

FIG. 2
-PRIOR ART RECEIVER-

FIG. 3
MULTICARRIER WIDEBAND RECEIVER

FIG. 4
DIGITAL AGC

METHOD AND APPARATUS FOR RECEIVING A WIDEBAND SIGNAL USING MULTIPLE AUTOMATIC GAIN CONTROLLERS

FIELD OF THE INVENTION

The present invention relates generally to wireless communication systems and, more particularly, to an apparatus and method for receiving a wideband communication signal in a wireless communication system.

BACKGROUND OF THE INVENTION

Communication systems that utilize coded communication signals are known in the art. One such system is a direct sequence code division multiple access (DS-CDMA) cellular communication system, such as set forth in the Telecommunications Industry Association Interim Standard 95A (TIA/EIA IS-95A) herein after referred to as IS-95A. In accordance with IS-95A, the coded communication signals used in the DS-CDMA system comprise spread spectrum signals that are transmitted in a common 1.25 MHz bandwidth channel between mobile stations and base transceiver stations (BTS) located at base sites of the wireless communication system. Each 1.25 MHz bandwidth portion of the radio-frequency (RF) spectrum, or 1.25 MHz bandwidth channel, carries spread spectrum signals centered around a particular carrier frequency and is commonly referred to as a narrowband DS-CDMA channel.

A communication signal transmitted in a narrowband DS-CDMA channel between a mobile station and a base site, is reflected off of nearby scatterers, such as buildings resulting in multipath propagation of the transmitted signal. These reflections produce replicas of the originally transmitted signal which arrive at a receiver, such as a base station receiver or a mobile station receiver, with various power levels at various times, depending on the effective propagation distances traveled by the replicas as well as signal interference (a.k.a. noise). Upon receipt by a receiver, the originally transmitted signal and its reflected replicas are filtered, correlated, despread, recombined and then decoded, within their applicable narrowband DS-CDMA channel.

Currently, there are numerous international standards proposals which suggest a wideband CDMA transmission signal configuration. Evolution from the current narrowband CDMA signal transmission configuration, which is designed to carry voice and low speed data, has been driven by a need to deploy higher rate voice and packet data services in a wireless communication environment. Two wideband CDMA signal transmission configurations have been described, a multi-carrier CDMA signal transmission configuration and a direct-spread CDMA signal transmission configuration. In the multi-carrier signal transmission carrier configuration, three 1.25 MHz narrow-band CDMA signals are represented in a 5 MHz bandwidth. Consequently, a communication signal centered at a particular carrier frequency may be transmitted at a maximum of 1.2288 mega chips per second (Mcps). Each 1.25 MHz carrier is approximately orthogonal to the others, thus providing the necessary orthogonal diversity paths when the carriers are transmitted from different antennas. Similarly, six 1.25 MHz carriers may be used in a 10 MHz bandwidth and twelve 1.25 MHz carriers may be used in a 20 MHz bandwidth. In the direct-spread CDMA signal transmission configuration, a communication signal is spread across an RF bandwidth equivalent to multiple narrowbands, for example, three 1.25 MHz CDMA carriers subsequently transmitted at 3.6864 Mcps. At the receiving end, the direct-spread signal is demodulated and converted to a digital signal stream, much like narrowband CDMA execution.

Unfortunately, when a wideband DS-CDMA communication system is overlaid across RF spectrum defined for multiple narrowband DS-CDMA communication system signals, conventional receiver front end processing, which uses only one AGC circuit to gain control the received signal before further processing, is inadequate. Specifically, when the multiple narrowband signals comprising the wideband, have unbalanced noise density with respect to each other, differing interference will be present in the bands. As a result, the signal-to-interference ratios (SIR) of the bands may be different. As a result of the varied SIRs, the prior art use of a single AGC for gain control in the receiver front end may yield non-optimal performance of the receiver.

Therefore, a need exists for a method and apparatus to provide receiver front end processing for a wideband communication signal which is easy to implement and overcomes signal gain control problems inherent in the prior art design.

DETAILED DESCRIPTION OF THE PREFERRED EMBODIMENT

Stated generally, a receiver which includes digital automatic gain control, for use in a wideband code division multiple access (CDMA) wireless communication system is disclosed. In the preferred embodiment, a wideband multicarrier wireless communication system conveys at least a first CDMA signal by a carrier centered at a first carrier frequency and a second CDMA signal by a carrier centered at a second carrier frequency. The receiver includes a radio frequency (RF) receiver front end for receiving the first and second CDMA signals to yield a set of in-phase (I) and quaternary phase (Q) components representative of the first and second CDMA signals. The receiver further includes a first and second filter for filtering the set of in-phase (I) and quaternary phase (Q) components to produce a filtered first and second set of in-phase (I) and quaternary phase (Q) components. A first and second digital automatic gain controller then adjusts the filtered first and second set of in-phase (I) and quaternary phase (Q) components to produce a gain adjusted first and second set of in-phase (I) and quaternary phase (Q) components for use in subsequent despreading. The digital AGC circuits maintain their total output signals at substantially fixed values, thus maintaining total interference of the gain adjusted first and second set of in-phase (I) and quaternary phase (Q) components at a fixed value.

In an alternate embodiment, a wideband direct spread wireless communication system conveys a wideband CDMA signal. The receiver includes a radio frequency (RF) receiver front end for receiving the receiving the wideband CDMA signal and outputting a corresponding set of in-phase (I) and quaternary phase (Q) components representing the wideband CDMA signal. The receiver further includes a first and second filter for filtering the set of in-phase (I) and quaternary phase (Q) components to produce a filtered first and second set of in-phase (I) and quaternary phase (Q) components. A first and second digital automatic gain controller then adjusts the filtered first and second set of in-phase (I) and quaternary phase (Q) components to produce a gain adjusted first and second set of in-phase (I) and quaternary phase (Q) components. Finally, the receiver includes a combiner to combine the gain adjusted first and second set of in-phase (I) and quaternary phase (Q) components yielding a combined signal for subsequent despreading, deinterleaving, and decoding.

A corresponding method generally implements each of the above recited receiver configurations.

Figure 1:
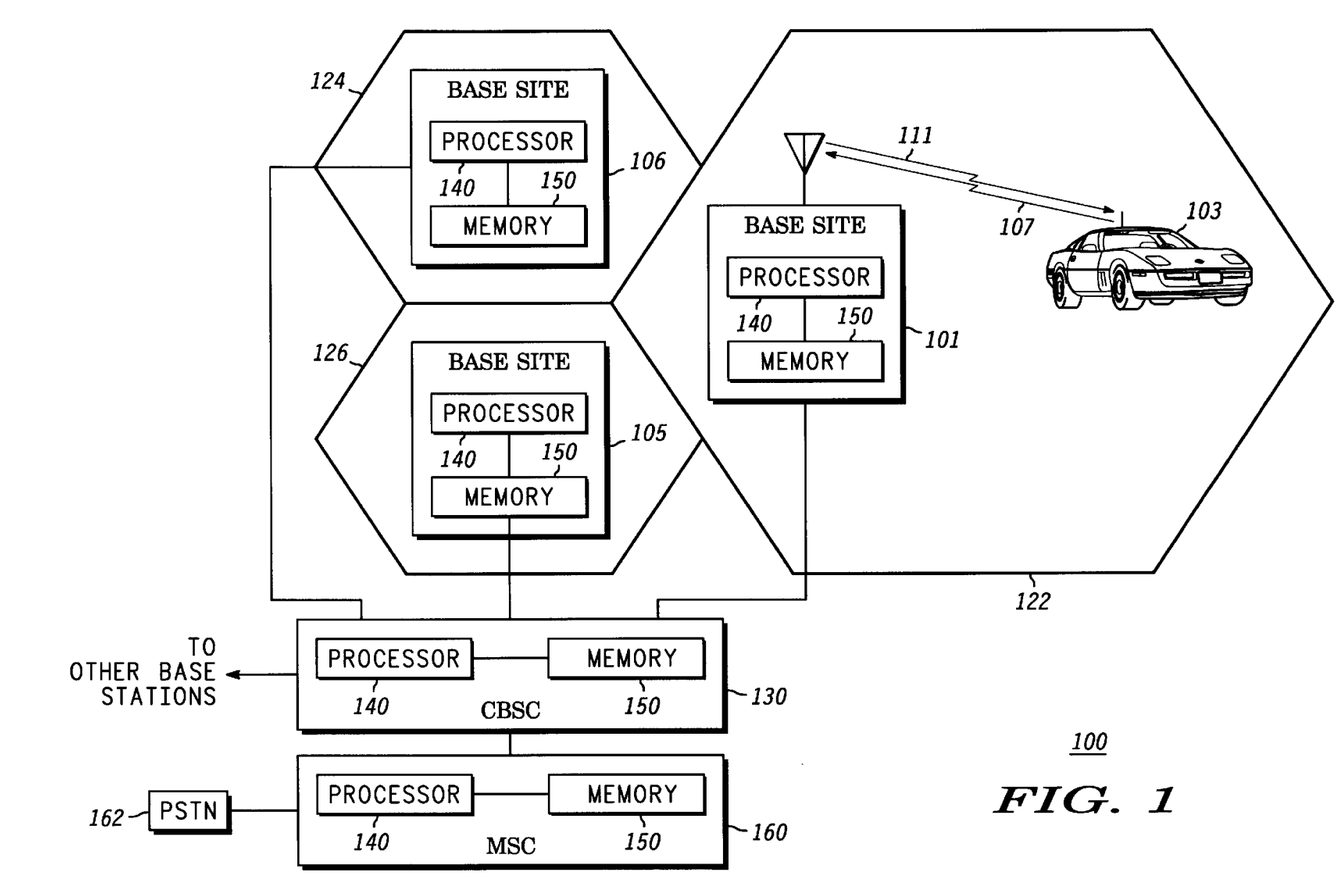
FIG. 1 depicts a typical prior art wireless communication system.

Turning now to the drawings, wherein like numerals designate like components, FIG. 1 depicts a typical prior art wireless communication system 100. Communication system 100 preferably comprises a direct sequence code division multiple access (DS-CDMA) cellular communication system, such as that set forth in the Telecommunications Industry Association Interim Standard 95A (TIA IS-95A).

Communication system 100 includes base sites 101, 106, 105 providing service to coverage areas 122, 124, and 126 respectively, and one or more mobile stations although only one mobile station 103 is shown. Base sites 101, 105 and 106 include, among other things, a processor 140 and a memory 150. Base site 101 includes a transceiver which transmits coded communication signals to, and receives coded communication signals from, mobile station 103 within a coverage area 122 of base site 101. A RAKE receiver within the transceiver provides independent tracking capability of incoming multipath coded communication signals from mobile stations, the construction and operation of RAKE receivers being well known in the art. Similarly, mobile station 103 includes a transceiver which transmits coded communication signals to, and receives coded communication signals from, base site 101 within a coverage area 122.

Base sites 101, 105, and 106 are coupled to a base station controller 130, which includes, among other things, a processor 140 and a memory 150, and which is in turn coupled to a mobile switching center 160, also including a processor 140 and a memory 150. Mobile switching center 160 is coupled to the public switched telephone network (PSTN) 162 using known techniques.

CDMA signals 107 and 111 are conveyed between mobile station 103 and base site 101 through a radio frequency (RF) channel. The RF channel includes a reverse link (mobile station 103 to base site 101) and a forward link (base site 101 to mobile station 103).

Figure 2:
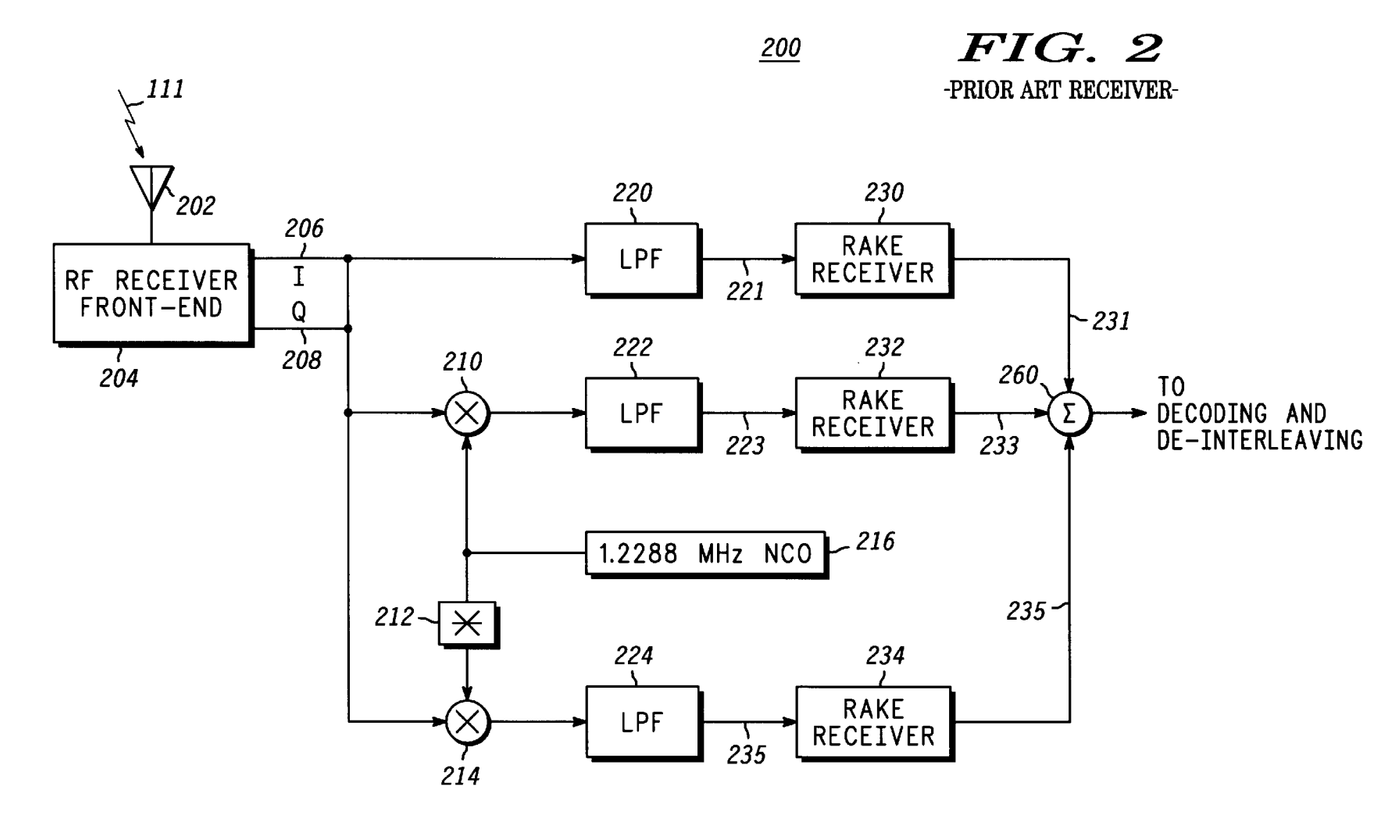
FIG. 2 is a block diagram of a prior art mobile station receiver for receiving a wireless communication signal.

FIG. 2 is a block diagram of a prior art mobile station receiver, generally designated mobile station receiver 200, for receiving a wideband wireless communication signal such as CDMA signal 111. Receiver 200 receives a wideband CDMA signal 111 via antenna 202. Receiver 200 may be within mobile station 103 (shown in FIG. 1). For purposes of discussion, a multicarrier receiver for receiving a 5 MHz wideband of three bands including three 1.25 MHz center frequencies, is shown. Front-end processing such as intermediate frequency demodulation, analog automatic gain control (AGC), and analog-to-digital (A/D) conversion of CDMA signal 111 is performed by well known methods and circuits at RF receiver front-end block 204. The analog AGC is typically employed in front of the analog-to-digital (A/D) converter in order to reduce the dynamic operating range of the A/D converter. In addition, RF receiver front-end block 204 further converts the digital signal, output from the A/D converter, to a set of in-phase (I) and quaternary phase (Q) components, 206 and 208.

Next, the set of in-phase (I) and quaternary phase (Q) components, 206 and 208, which may be frequency shifted by mixers 210 and 214 responsive to a numerically controlled oscillator 216 and a complex conjugator 212, are filtered in low pass filters (LPF) 220, 222, and 224, the operation and construction of LPFs being generally well known. Accordingly, the operation of LPFs 220, 222, and 224 yield three corresponding baseband signals 221, 223, and 225, each comprised of a set of filtered in-phase (I) and quaternary phase (Q) components. The mixer frequencies are selected, via numerically controlled oscillator (NCO) 216, such that the center frequencies of each of the bands will be zero after mixing. Consequently, each LPF filter such as LPFs 220, 222, and 224, filters only that that portion of the signal which has been mixed to a center frequency of zero. This results in the three distinct baseband signals, 221, 223, and 225.

The three corresponding baseband signals 221, 223, and 225 are then input to three corresponding despreaders, for example, RAKE receivers 230, 232, and 234, the operation and construction of RAKE receivers being generally well known. RAKE receivers 230, 232, and 234 despread, coherently demodulate, and finger combine baseband signals 221, 223, and 225 to produce three corresponding despread signals 231, 233, and 235. Despread signals 231, 233, and 235 are then combined in a combiner 260 to produce a combined signal which is subsequently deinterleaved and decoded.

Unfortunately, in applications which overlay wideband CDMA capability on RF spectrum fully or partially occupied by narrowband or IS-95 CDMA systems, a single analog AGC in RF receiver front end 204 is not optimal due, in part, to the substantially low signal to noise ratio of wideband CDMA signal 111. In addition, when multiple narrowband signals have unbalanced noise density with respect to each other, the signal-to-interference ratios (SIR) of the narrowbands may be different. Accordingly, the use of a single analog AGC for gain control in the receiver front end, yields non-optimal performance of the receiver.

Figure 3:
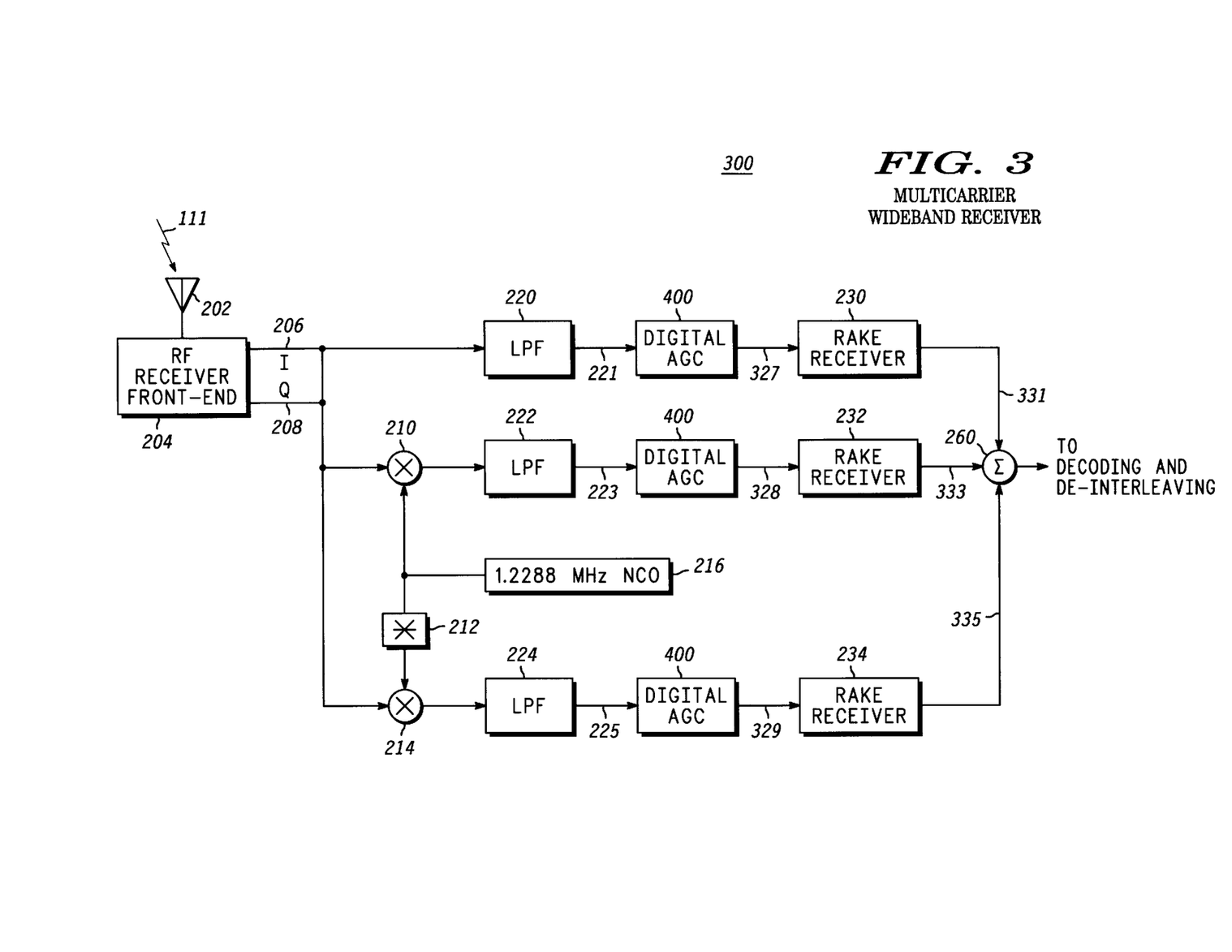
FIG. 3 is a block diagram of a mobile station receiver for receiving a wireless communication signal, according to a preferred embodiment of the present invention.

FIG. 3 is a block diagram of a mobile station receiver, generally designated multi-carrier wideband receiver 300, for receiving a multi-carrier wideband wireless communication signal, according to a preferred embodiment of the present invention. As shown in FIG. 3, digital AGCs 400, which normalize the variance of interference (i. e. noise) of the signal components input to RAKE receivers 230, 232, and 234, are included in accordance with the invention.

Multi-carrier wideband receiver 300 receives a multi-carrier wideband CDMA signal 111 via antenna 202. Front-end processing such as intermediate frequency demodulation, analog automatic gain control, analog-to-digital conversion, and in-phase (I) and quaternary phase (Q)

separation, of CDMA signal 111 is performed by well known methods and circuits at RF receiver front-end block 204. RF receiver front-end block 204 outputs a set of in-phase (I) and quaternary phase (Q) components, 206 and 208, which are representative of multi-carrier wideband CDMA signal 111.

Next, the set of in-phase (I) and quaternary phase (Q) components, 206 and 208, which may be frequency shifted by mixers 210 and 214, are filtered in low pass filters (LPF) 220, 222, and 224, the operation and construction of LPFs being generally well known. Accordingly, operation of LPFs 220, 222, and 224 yield three corresponding baseband signals 221, 223, and 225, each comprised of a corresponding set of in-phase (I) and quaternary phase (Q) components. The mixer frequencies are selected, via a numerically controlled oscillator (NCO) 216 and a complex conjugato 212, such that the carrier frequencies of the desired narrowband signal will be zero after mixing.

Each of the three corresponding baseband signals 221, 223, and 225 are then input to a corresponding digital AGC 400, yielding three corresponding gain adjusted set of in-phase (I) and quaternary phase (Q) components 327, 328, and 329. Each digital AGC 400 operates at the same nominal value thereby producing substantially equivalent noise power in gain adjusted sets of in-phase (I) and quaternary phase (Q) components 327, 328, and 329. Gain adjusted sets of in-phase (I) and quaternary phase (Q) components 327, 328, and 329 are thereupon input to three corresponding despreaders, for example, RAKE receivers 230, 232, and 234. In addition to reducing the dynamic operating range needed for RAKE receivers 230, 232, and 234, the addition of the digital AGCs 400 serves to normalize the variance of interference (I. e. noise). In normalizing noise variance, the digital AGCs 400 optimize the gain adjusted sets of in-phase (I) and quaternary phase (Q) components 327, 328, and 329 for input to RAKE receivers 230, 232, and 234.

RAKE receivers 230, 232, and 234 then despread, coherently demodulate, and finger combine, gain adjusted sets of in-phase (I) and quaternary phase (Q) components 327, 328, and 329 to produce three corresponding despread signals 331, 333, and 335. Despread signals 331, 333, and 335 are combined in a combiner 260 to produce a combined signal which is subsequently de-interleaved and decoded, yielding a digital signal stream substantially representative of wideband CDMA signal 111.

Figure 5:
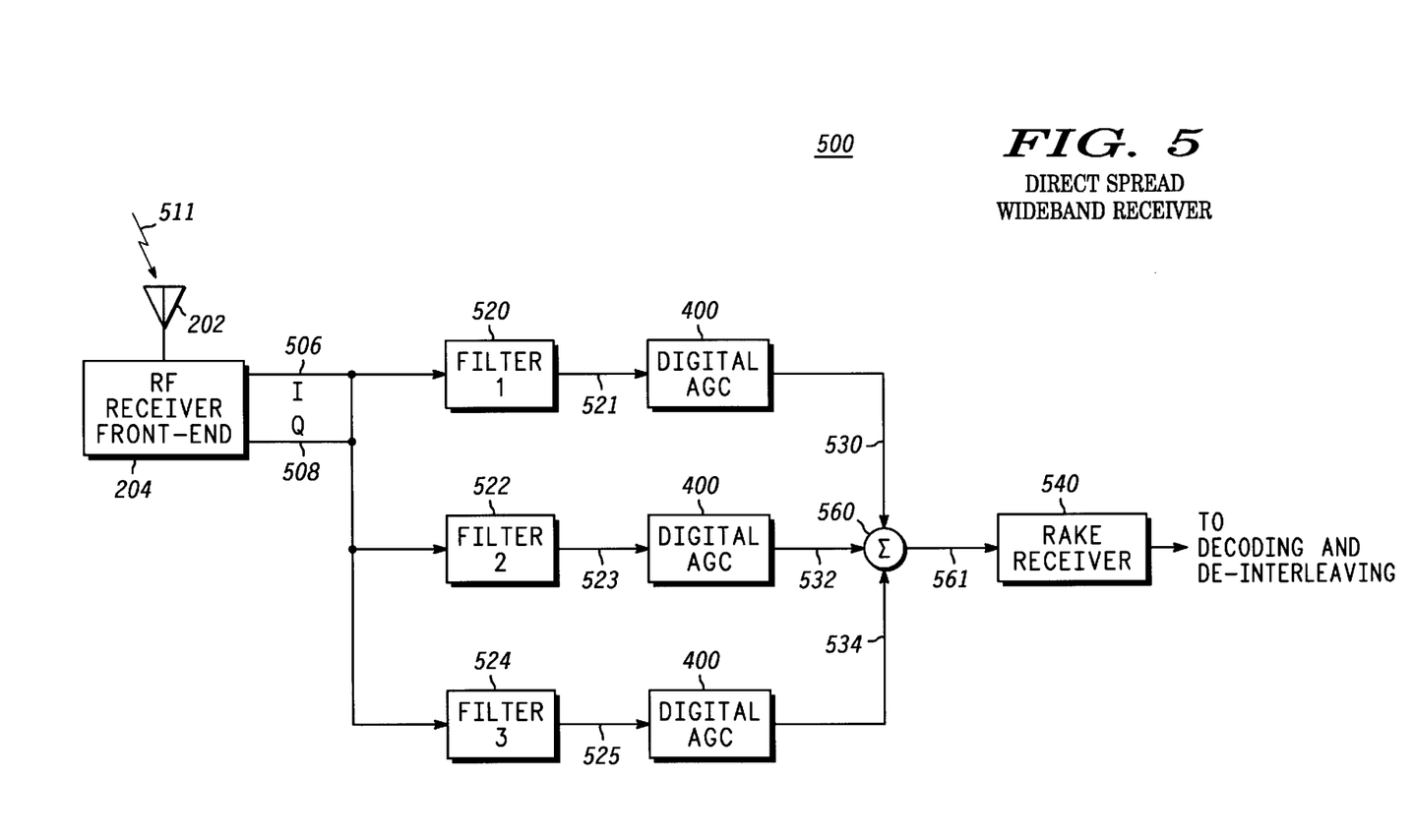
FIG. 5 is a block diagram of a mobile station receiver for receiving a wireless communication signal, according to an alternate embodiment of the present invention.

Similarly, digital AGCs 400 may be employed in a receiver suitable for receiving a direct spread wideband CDMA signal. FIG. 5 is a block diagram of a mobile station receiver, generally designated direct spread wideband receiver 500, for receiving a direct spread wideband wireless communication signal, according to an alternate embodiment of the present invention. Direct spread wideband receiver 500 receives a direct spread wideband CDMA signal 511 via antenna 202. Direct spread wideband receiver 500 may be within mobile station 103 (shown in FIG. 1). For purposes of discussion, a direct spread wideband receiver for receiving a 5 MHz direct spread wideband signal, is shown.

Front-end processing such as intermediate frequency demodulation, analog automatic gain control (AGC), analog-to-digital conversion, and in-phase (I) and quaternary phase (Q) separation into a set of in-phase (I) and quaternary phase (Q) components, 506 and 508, of direct spread wideband CDMA signal 511 is performed by well known methods and circuits at RF front-end receiver block 204.

Next, the set of in-phase (I) and quaternary phase (Q) components, 506 and 508, are filtered in bandpass filters 520, 522, and 524, the operation and construction of bandpass filters being generally well known. Unlike LPFs, the center frequencies of bandpass filters 520, 522, and 524, are selected such that the combined passbands of the three filters span the wideband and may be designated as filters 1, 2, and 3. Accordingly, operation of bandpass filters 520, 522, and 524 yield three corresponding band signals 521, 523, and 525 in passband form, each comprised of a set of filtered in-phase (I) and quaternary phase (Q) components and representative of segments or bands, of 5 MHz wideband signal 111.

Each of the three corresponding band signals 521, 523, and 525 are then input to a corresponding digital AGC 400 to produce three corresponding gain adjusted sets of in-phase (I) and quaternary phase (Q) components 530, 532, and 534. Each digital AGC 400 operates at the same nominal value thereby yielding substantially equivalent noise density in the three bands comprising gain adjusted sets of in-phase (I) and quaternary phase (Q) components 530, 532, and 534. Gain adjusted sets of in-phase (I) and quaternary phase (Q) components 530, 532, and 534 are thereupon combined in a combiner 560 to produce a combined signal 561 suitable for despreading in a RAKE receiver 540. As a result of the normalization of the noise variance by the digital AGCs, the noise densities of gain adjusted sets of in-phase (I) and quaternary phase (Q) components 530, 532, and 534 are substantially equivalent, thus yielding noise components in combined signal 561 which are substantially constant across all three bands. RAKE receiver 540 then despreads, coherently demodulates, and finger combines combined signal 561, yielding a digital signal stream substantially representative of wideband CDMA signal 111.

Figure 4:
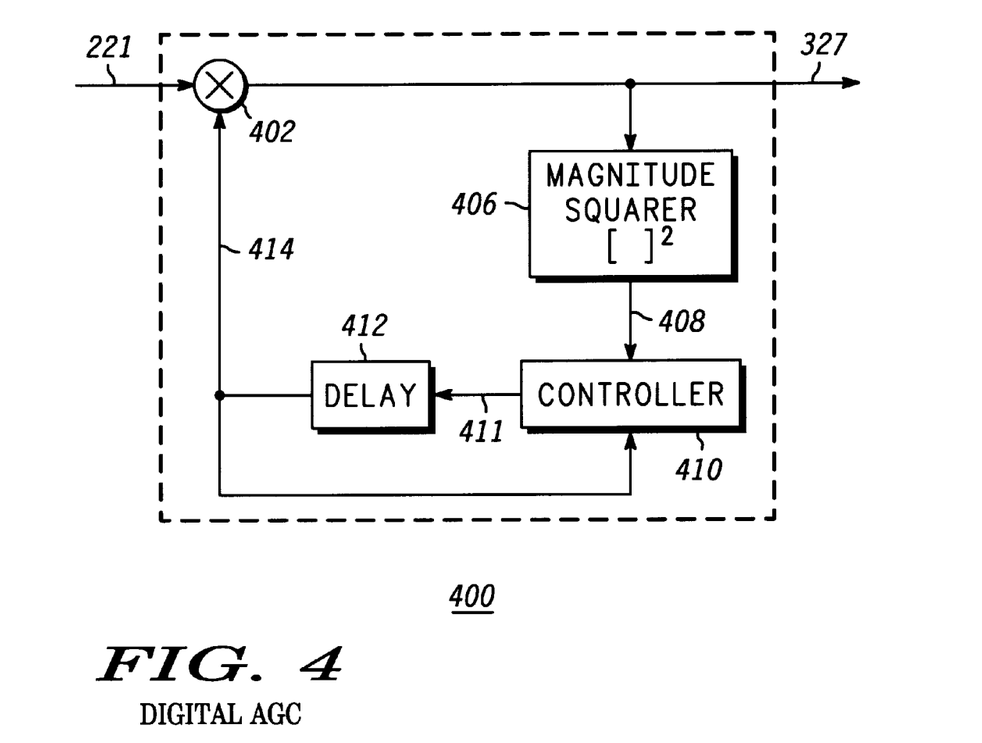
FIG. 4 is a partial block diagram of the digital auto gain control depicted in FIG. 3.

FIG. 4 is a partial block diagram of the digital AGC 400 depicted in FIG. 3. As is shown, digital AGC 400, gain adjusts baseband signal 221 received from its corresponding LPF 220. Gain adjusted complex signal comprised of a gain adjusted set of in-phase (I) and quaternary phase (Q) components 327 is the result of an adjusted or scaled version of baseband signal 221. The adjustment is made by a gain adjuster element 402, gain adjuster element 402 responsive to a delayed gain adjustment value 414 such that the noise power of the gain adjusted set of in-phase (I) and quaternary phase (Q) components 327 is substantially equal to gain adjusted set of in-phase (I) and quaternary phase (Q) components 328 as well as gain adjusted set of in-phase (I) and quaternary phase (Q) components 329 (shown in FIG. 3), output from corresponding digital AGCs 400.

As previously discussed, baseband signal 221 output from LPF 220 is a complex signal, comprised of a filtered set of in-phase (I) and quaternary phase (Q) components, having a real part (quaternary phase component), and an imaginary part (in-phase component). Accordingly, gain adjusted set of in-phase (I) and quaternary phase (Q) components 327 is also a complex signal having a real part and an imaginary part. In addition to providing an output to RAKE receiver 230, gain adjusted set of in-phase (I) and quaternary phase (Q) components 327 is input to a magnitude squarer 406. Magnitude squarer 406 generates a squared magnitude value 408 of gain adjusted set of in-phase (I) and quaternary phase (Q) components 327. Squared magnitude value 408 is then input to a controller 410 and compared to a predetermined AGC reference value (not shown) to form a comparison value. Delayed gain adjustment value 414 ouput from a delay block 412, is also input via a feedback arrangement to controller 410. Based on the comparison value and the delayed gain adjustment value 414, controller 410 outputs a new gain adjustment value 411. New gain adjustment value 411 is delayed in delay block 412, yielding a new delayed gain adjustment value 414 used to gain adjust baseband signal 221. The new delayed gain adjustment value 414 is generated such that the squared magnitude value 408 of gain adjusted set of in-phase (I) and quaternary phase (Q) components 327 is substantially equal to the predetermined AGC reference value.

FIGS. 3, 4 and 5 may be implement in either software or hardware, or may be included as a function in an ASIC.

Figure 6:
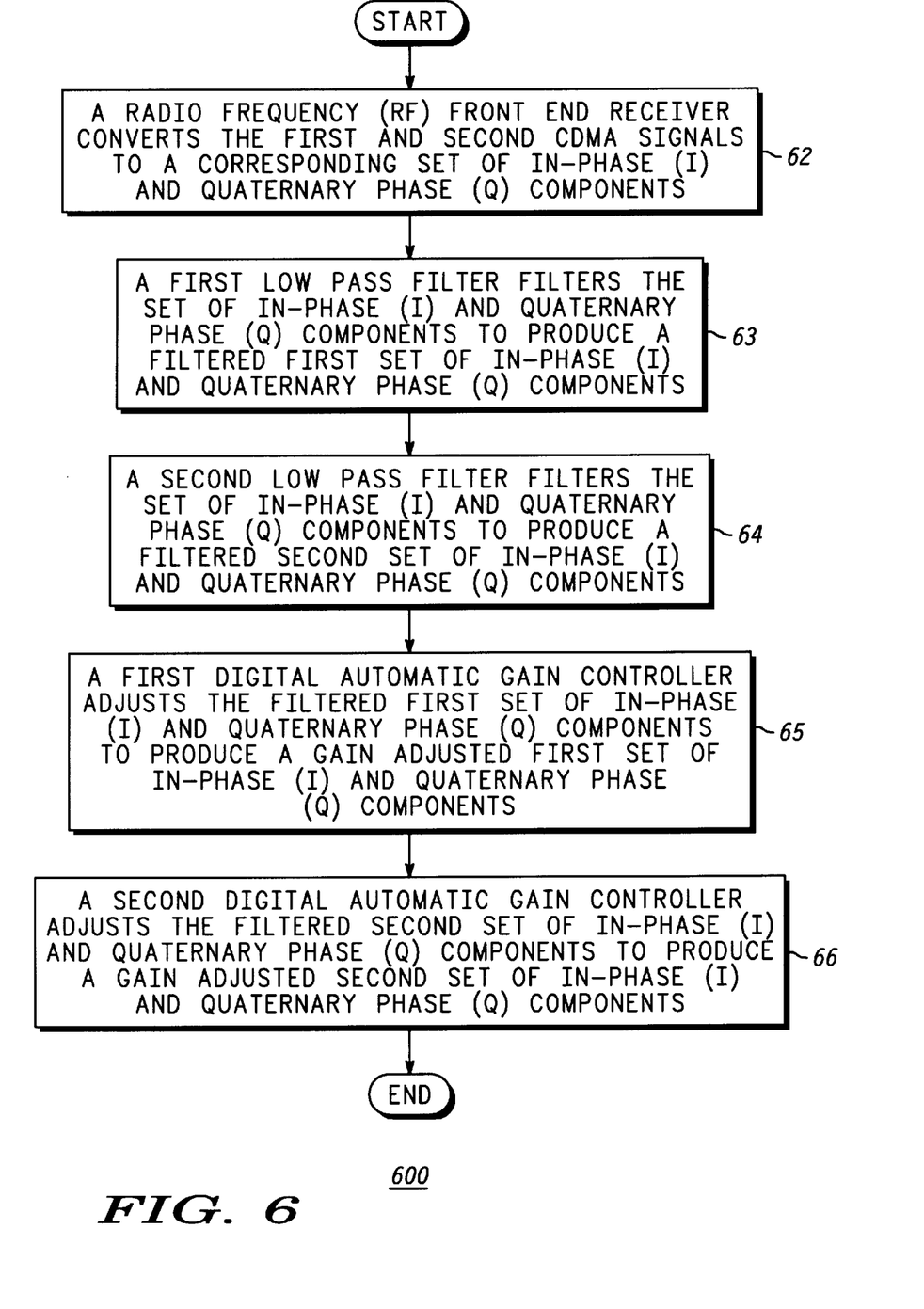
FIG. 6 is a flow chart of a method for receiving a wireless communication signal, according to the preferred embodiment of the present invention.

FIG. 6 is a flow chart of a method for receiving a multi-carrier wideband wireless communication signal, generally designated 600, according to a preferred embodiment of the present invention. In method 600, a wideband CDMA system conveys CDMA signals in a multicarrier arrangement. Thus, for discussion purposes, at least a first CDMA signal is transmitted via a carrier centered at a first frequency and a second CDMA signal is transmitted via a carrier centered at a second frequency. Method 600 starts at block 62 where the first and second CDMA signals are converted to a corresponding set of in-phase (I) and quaternary phase (Q) components 206 and 208 by a radio frequency (RF) receiver front end 204, according to well known methods. The set of in-phase (I) and quaternary phase (Q) components 206 and 208 are then filtered by a first filter 222 to produce a filtered first set of in-phase (I) and quaternary phase (Q) components 223 at block 63. Similarly, the set of in-phase (I) and quaternary phase (Q) components are filtered by a second filter 224 to produce a filtered second set of in-phase (I) and quaternary phase (Q) components 225 at block 64. The set of in-phase (I) and quaternary phase (Q) components are frequency shifted by mixers 210 and 214 such that the center frequencies of each of the bands will be zero, prior to filtering. At block 65, filtered first set of in-phase (I) and quaternary phase (Q) components 223 are adjusted by a first digital automatic gain controller 400, to produce a gain adjusted first set of in-phase (I) and quaternary phase (Q) components 328 for use in subsequent despreading. Moreover, filtered second set of in-phase (I) and quaternary phase (Q) components 225 are adjusted by a second digital automatic gain controller 400 to produce a gain adjusted second set of in-phase (I) and quaternary phase (0) components 329 for use in subsequent despreading at block 66.

Figure 7:
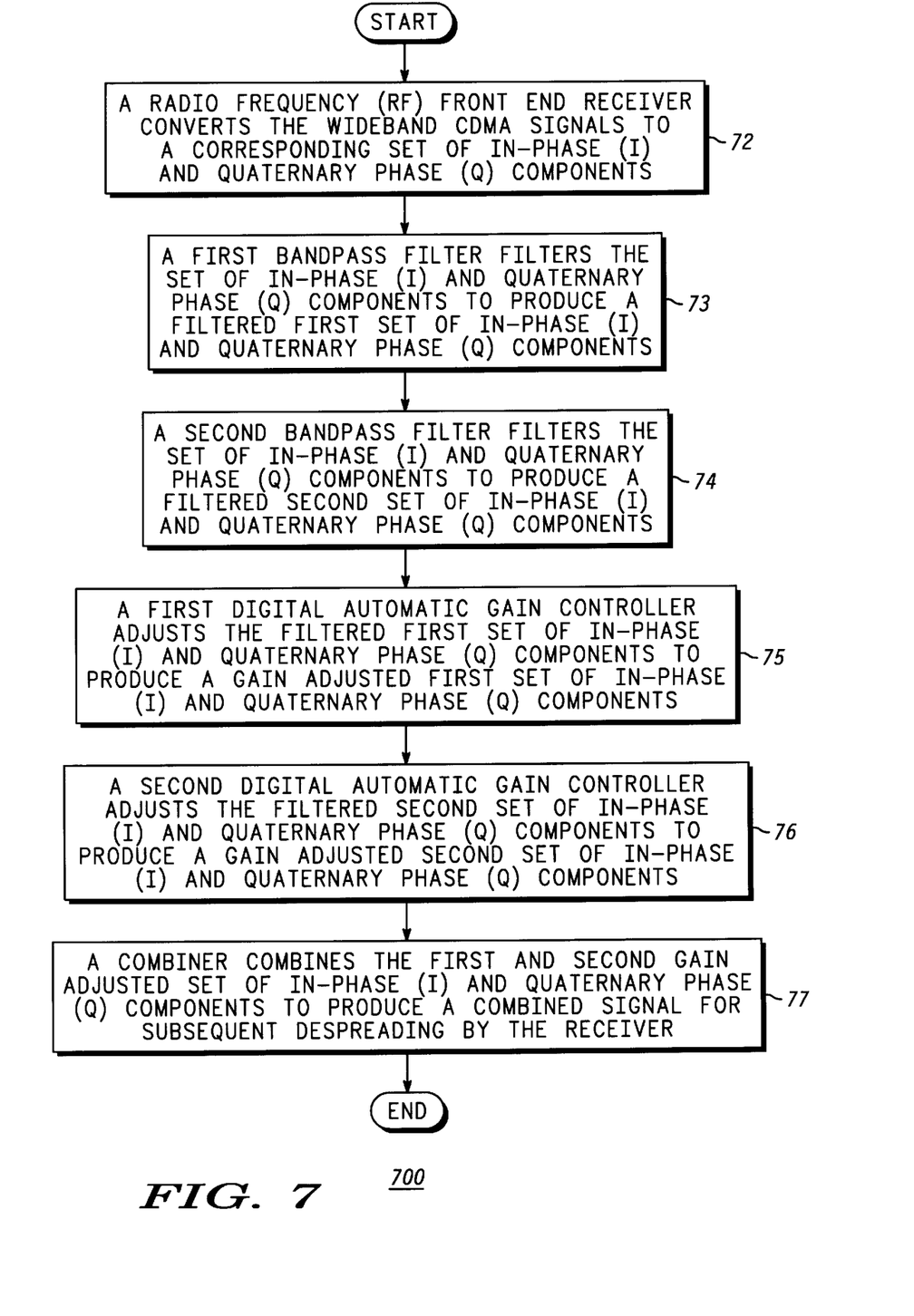
FIG. 7 is a flow chart of a method for receiving a wireless communication signal, according to the alternate embodiment of the present invention.

FIG. 7 is a flow chart of a method for receiving a direct spread wideband wireless communication signal, generally designated 700, according to an alternate embodiment of the present invention. In method 700, a wideband CDMA system conveys CDMA signals in a direct-spread arrangement. Thus, for discussion purposes, at least one wideband CDMA signal 511 is transmitted. Method 700 starts at block 72 where wideband CDMA signal 511 is converted to a corresponding set of in-phase (I) and quaternary phase (Q) components 506 and 508, by a radio frequency (RF) receiver front end 204, according to well known methods. The set of in-phase (I) and quaternary phase (Q) components are then filtered by a first filter 520 to produce a filtered first set of in-phase (I) and quaternary phase (Q) components 521 at block 73. Similarly, the set of in-phase (I) and quaternary phase (Q) components 506 and 508, are filtered by a second filter 522 to produce a filtered second set of in-phase (I) and quaternary phase (Q) components 523 at block 74. At block 75, filtered first set of in-phase (I) and quaternary phase (Q) components 521 are then adjusted by a first digital automatic gain controller 400, to produce a gain adjusted first set of in-phase (I) and quaternary phase (Q) components 530 for use in subsequent combining. Moreover, filtered second set of in-phase (I) and quaternary phase (Q) components 523 are adjusted by a second digital automatic gain controller 400 to produce a gain adjusted second set of in-phase (I) and quaternary phase (Q) components 532 for use in subsequent combing at block 76. Next, at block 77 gain adjusted first and second set of in-phase (I) and quaternary phase (Q) components 530 and 532 are combined in a combiner 560 to produce a combined signal for subsequent despreading by the receiver. After despreading, the signal is further deinterleaved and decoded, yielding a digital signal stream substantially representative of wideband CDMA signal 511.

The IS-95A forward link channel and its application in wideband CDMA systems has been specifically referred to herein, but the present invention is applicable to any digital channel, including but not limited to the reverse link IS-95A channel, all wideband forward and reverse link channels and to all forward- and reverse-link TDMA channels, in all TDMA systems such as Groupe Special Mobile (GSM), a European TDMA system, Pacific Digital Cellular (PDC), a Japanese TDMA system, and Interim Standard 54 (IS-54), a U.S. TDMA system.

The principles of the present invention which apply to a cellular-based digital communication system, include but are not limited to personal communicating systems, trunked systems, satellite systems and data networks. Likewise, the principles of the present invention which apply to all types of digital radio frequency channels also apply to other types of communication channels, such as radio frequency signaling channels, electronic data buses, wireline channels, optical fiber links and satellite links.

It will furthermore be apparent that other forms of the invention, and embodiments other than the specific embodiments described above, may be devised without departing from the spirit and scope of the appended claims and their equivalents.

What I claim is:

1. A receiver for use in a wideband code division multiple access (CDMA) wireless communication system, the CDMA wireless communication system conveying a wideband CDMA signal including at least a first CDMA signal by a carrier centered at a first center frequency and a second CDMA signal by a carrier centered at a second center frequency, the receiver comprising:

a radio frequency (RF) receiver front end for receiving the wideband CDMA signal and converting the wideband CDMA signal to the first and second CDMA signals by yielding a set of in-phase (I) and quaternary phase (Q) components representative of the first and second CDMA signals;

a first filter for filtering the set of in-phase (I) and quaternary phase (Q) components to produce a filtered first set of in-phase (I) and quaternary phase (Q) components;

a second filter for filtering the set of in-phase (I) and quaternary phase (Q) components to produce a filtered second set of in-phase (I) and quaternary phase (Q) components;

a first digital automatic gain controller for adjusting the filtered first set of in-phase (I) and quaternary phase (Q) components to produce a gain adjusted first set of in-phase (I) and quaternary phase (Q) components for use in subsequent despreading;

a second digital automatic gain controller for adjusting the filtered second set of in-phase (I) and quaternary phase (Q) components to produce a gain adjusted second set of in-phase (I) and quaternary phase (Q) components for use in subsequent despreading.

2. The receiver of claim 1, wherein the first and second filters further comprise low pass filters responsive to mixers.

3. The receiver of claim 2, wherein the center frequencies of the first and second filters are generated by a numerically controlled oscillator and a complex conjugator.

4. The receiver of claim 1, wherein the first and second digital automatic gain controllers operate at the same nominal value thereby yielding substantially equivalent noise power in the gain adjusted first and second set of in-phase (I) and quaternary phase (Q) components.

5. The receiver of claim 1, further comprising:
a first despreader having as input the gain adjusted first set of in-phase (I) and quaternary phase (Q) components and outputting a first despread signal related to the first CDMA signal;
a second despreader having as input the gain adjusted second set of in-phase (I) and quaternary phase (Q) components and outputting a second despread signal related to the second CDMA signal.

6. The receiver of claim 5, wherein the first and second despreaders further comprise a RAKE receiver.

7. The receiver of claim 5, further comprising:
a combiner for combining the first and second despread signals to produce a combined signal representative of the wideband CDMA signal for subsequent decoding by the receiver.

8. The receiver of claim 1, wherein the first and second digital automatic gain controllers further comprise:
a gain adjuster element for gain adjusting the filtered set of in-phase (I) and quaternary phase (Q) components to produce a gain adjusted complex signal, the gain adjuster element responsive to a delayed gain adjustment value;
a magnitude squarer for receiving the gain adjusted complex signal and generating a squared magnitude of the gain adjusted complex signal;
a controller for
receiving the squared magnitude of the gain adjusted complex signal and the delayed gain adjustment value,
comparing the squared magnitude of the gain adjusted complex signal to an AGC reference value to form a comparison value, and
generating a new gain adjustment value based on the comparison value such that the squared magnitude of the gain adjusted complex signal is substantially equal to the AGC reference value; and
a delay for delaying the new gain adjustment value to produce the delayed gain adjustment value.

9. The receiver of claim 8, wherein the gain adjusted complex signal comprises a gain adjusted set of in-phase (I) and quaternary phase (Q) components.

10. In a wideband code division multiple access wireless communication system conveying a wideband CDMA signal including at least a first CDMA signal transmitted via a carrier centered at a first frequency and a second CDMA signal transmitted via a carrier centered at a second frequency, the system comprising a receiver, a method for receiving the first and second CDMA signals comprising:
converting the wideband CDMA signal to a set of in-phase (I) and quaternary phase (Q) components by a radio frequency (RF) receiver front end, wherein the set of in-phase (I) and quaternary phase (Q) components representing the first and second CDMA signals;
filtering the set of in-phase (I) and quaternary phase (Q) components by a first filter to produce a filtered first set of in-phase (I) and quaternary phase (Q) components;
filtering the set of in-phase (I) and quaternary phase (Q) components by a second filter to produce a filtered second set of in-phase (I) and quaternary phase (Q) components;
adjusting, by a first digital automatic gain controller, the filtered first set of in-phase (I) and quaternary phase (Q) components to produce a gain adjusted first set of in-phase (I) and quaternary phase (Q) components for use in subsequent despreading; and
adjusting, by a second digital automatic gain controller, the filtered second set of in-phase (I) and quaternary phase (Q) components to produce a gain adjusted second set of in-phase (I) and quaternary phase (Q) components for use in subsequent despreading.

11. The method according to claim 10, wherein the step of filtering by the first and second filter further comprises the step of:
filtering by a first and second low pass filter operating at a first and second frequency, the first and second frequency determined by a first and second mixer responsive to a numerically controlled oscillator.

12. The method according to claim 10, wherein the step of adjusting by the first and second digital automatic gain controller further comprises the step of:
operating the first and second digital automatic gain controllers at a substantially identical nominal value to yield substantially equivalent noise power in gain adjusted first and second sets of in-phase (I) and quaternary phase (Q) components.

13. The method according to claim 10, further comprising the steps of:
despreading the gain adjusted first set of in-phase (I) and quaternary phase (Q) components by a first RAKE receiver to produce a first despread signal related to the first CDMA signal centered at the first carrier frequency; and
despreading the gain adjusted second set of in-phase (I) and quaternary phase (Q) components by a second RAKE receiver to produce a second despread signal related to the second CDMA signal centered at the second carrier frequency.

14. The method according to claim 13, further comprising the step of:
combining the first and second despread signals to produce a combined signal representing the wideband CDMA signal for subsequent decoding by the receiver.

15. A receiver for use in a code division multiple access (CDMA) wireless communication system, the CDMA wireless communication system conveying a wideband CDMA signal, the receiver comprising:
a radio frequency (RF) receiver front end for receiving the wideband CDMA signal and outputting a corresponding set of in-phase (I) and quaternary phase (Q) components representing the wideband CDMA signal;
a first filter for filtering the corresponding set of in-phase (I) and quaternary phase (Q) components to produce a filtered first set of in-phase (I) and quaternary phase (Q) components;
a second filter for filtering the corresponding set of in-phase (I) and quaternary phase (Q) components to produce a filtered second set of in-phase (I) and quaternary phase (Q) components;
a first digital automatic gain controller for adjusting the filtered first set of in-phase (I) and quaternary phase (Q) components to produce a gain adjusted first set of in-phase (I) and quaternary phase (Q) components;
a second digital automatic gain controller for adjusting the filtered second set of in-phase (I) and quaternary phase (Q) components to produce a gain adjusted second set of in-phase (I) and quaternary phase (Q) components; and a combiner for combining the gain adjusted first and second set of in-phase (I) and quaternary phase (Q) components to produce a combined signal for subsequent despreading, deinterleaving, and decoding by the receiver.

16. The receiver of claim 15, wherein the first and second filters further comprise bandpass filters.

17. The receiver of claim 15, wherein the first and second digital automatic gain controllers operate at a substantially identical nominal value yielding equivalent noise power in gain adjusted first and second sets of in-phase (I) and quaternary phase (Q) components.

18. The receiver of claim 15, further comprising:
a despreader, having as an input the combined signal and outputting a despread signal related to the wideband CDMA signal.

19. The receiver of claim 15, wherein the despreader further comprises a RAKE receiver.

20. The receiver of claim 15, wherein the first and second digital automatic gain controllers further comprise:
a gain adjuster element for gain adjusting the filtered set of in-phase (I) and quaternary phase (Q) components to produce a gain adjusted complex signal, the gain adjuster element responsive to a delayed gain adjustment value;
a magnitude squarer for receiving the gain adjusted complex signal and generating a squared magnitude of the gain adjusted complex signal;
a controller for
receiving the squared magnitude of the gain adjusted complex signal and the delayed gain adjustment value,
comparing the squared magnitude of the gain adjusted complex signal to an AGC reference value to form a comparison value, and
generating a new gain adjustment value based on the comparison value such that the squared magnitude of the gain adjusted complex signal is substantially equal to the AGC reference value; and
a delay for delaying the new gain adjustment value to produce the delayed gain adjustment value.

21. The receiver of claim 20, wherein the gain adjusted complex signal comprises a gain adjusted set of in-phase (I) and quaternary phase (Q) components.

22. In a code division multiple access wireless communication system conveying a wideband CDMA signal, a method for receiving the wideband COMA signal comprising:

converting the wideband CDMA signal to a corresponding set of in-phase (I) and quaternary phase (Q) components by a radio frequency (RF) receiver front end;
filtering the set of in-phase (I) and quaternary phase (Q) components by a first filter to produce a filtered first set of in-phase (I) and quaternary phase (Q) components;
filtering the set of in-phase (I) and quaternary phase (Q) components by a second filter to produce a filtered second set of in-phase (I) and quaternary phase (Q) components;
adjusting, by a first digital automatic gain controller, the filtered first set of in-phase (I) and quaternary phase (Q) components to produce a gain adjusted first set of in-phase (I) and quaternary phase (Q) components for use in subsequent combining;
adjusting, by a second digital automatic gain controller, the filtered second set of in-phase (I) and quaternary phase (Q) components to produce a gain adjusted second set of in-phase (I) and quaternary phase (Q) components for use in subsequent combining; and
combining the gain adjusted first and second set of in-phase (I) and quaternary phase (Q) components related to the wideband CDMA signal to produce a combined signal for subsequent despreading by the receiver.

23. The method according to claim 22, wherein the step of filtering by the first and second filter further comprises the step of:
filtering by a first and second bandpass filter operating at a first and second center frequency.

24. The method according to claim 22, wherein the step of adjusting by the first and second digital automatic gain controller further comprises the step of:
operating the first and second digital automatic gain controllers at the same nominal value to yield substantially equivalent noise power in the gain adjusted first and second set of in-phase (I) and quaternary phase (Q) components.

25. The method according to claim 22, further comprising the step of:
despreading the combined signal by a RAKE receiver to produce a despread signal related to the wideband CDMA signal.

26. The method according to claim 25, wherein the despread signal is further de-interleaved and decoded to produce at least one communication signal representative of the wideband CDMA signal.

* * * * *